United States Patent [19]

Warashina et al.

[11] Patent Number: 5,801,081
[45] Date of Patent: Sep. 1, 1998

[54] SEMICONDUCTOR DEVICE AND METHOD OF MANUFACTURING SEMICONDUCTOR DEVICE

[75] Inventors: Suguru Warashina; Osamu Tsuboi, both of Kawasaki, Japan

[73] Assignee: Fujitsu Ltd., Kawasaki, Japan

[21] Appl. No.: 864,736

[22] Filed: May 28, 1997

Related U.S. Application Data

[62] Division of Ser. No. 796,493, Feb. 5, 1997, Pat. No. 5,698,885, which is a continuation of Ser. No. 374,295, Jan. 19, 1995, abandoned.

[30] Foreign Application Priority Data

Mar. 17, 1994 [JP] Japan ................................. 6-046950
Nov. 30, 1994 [JP] Japan ................................. 6-297376

[51] Int. Cl.$^6$ ............................................. H01L 21/76
[52] U.S. Cl. ..................... 438/410; 438/404; 438/405; 438/443
[58] Field of Search ................................ 438/404, 405, 438/410, 443

[56] References Cited

U.S. PATENT DOCUMENTS

| 4,889,829 | 12/1989 | Kawai ................................. 438/405 |
| 5,125,007 | 6/1992 | Yamaguchi et al. |
| 5,426,062 | 6/1995 | Hwang ................................. 438/405 |
| 5,547,886 | 8/1996 | Harada ................................. 438/405 |

FOREIGN PATENT DOCUMENTS

4-116846   4/1992   Japan.

OTHER PUBLICATIONS

H. Fukuda, et al., "High–Performance Buried–Gate MOFETs with RTO–grown Ultrathin Gate Oxide Films", *Extended Abstracts*, Makuhari, 1993, pp. 17–19.
M. Haond, et al., Lateral Isolation in SOI CMOS Technology, *Solid State Technology*, Jul. 1991, pp. 47–52.

*Primary Examiner*—Trung Dang
*Attorney, Agent, or Firm*—Staas & Halsey

[57] ABSTRACT

The present invention relates to a method of manufacturing a semiconductor device for forming an insulated gate field effect transistor in a completely isolated SOI layer, and has for its object to prevent depletion or inversion surely by introducing impurities of sufficiently high concentration into an SOI layer adjacent to an isolating film filled up between element regions of the SOI layer and a backing insulating layer and to aim at flattening of the SOI substrate surface, and further, includes the steps of implanting impurity ions into a semiconductor layer from an oblique direction so as to reach the semiconductor layer under an oxidation-preventive mask using the oxidation-preventive mask as a mask for ion implantation, heating the semiconductor layer in an oxidizing atmosphere with the oxidation-preventive mask so as to form a local oxide film to isolate the semiconductor layer, and also forming a impurity region with impurities implanted into the semiconductor layer in a region adjacent to the local oxide film and to at least an insulating layer under the semiconductor layer.

4 Claims, 16 Drawing Sheets

SEMICONDUCTOR DEVICE AND METHOD OF MANUFACTURING SEMICONDUCTOR DEVICE

This application is a division of application Ser. No. 08/796,493, filed Feb. 5, 1997, now U.S. Pat. No. 5,698,885, which is a continuation of application Ser. No. 08/374,295, filed Jan. 19, 1995, now abandoned.

BACKGROUND OF THE INVENTION

1. Field of the Invention

The present invention relates to a semiconductor device in which adjacent element regions are isolated completely from each other by an isolating film filled between the element regions of a silicon-on-insulator layer (hereinafter referred to as an SOI layer) and an insulated gate field effect transistor is formed in the element region, and to a method of manufacturing the same.

2. Description of the Prior Art

An SOI substrate capable of completely isolating element regions has been used as a semiconductor substrate for forming a micro MOS transistor or the like in recent years. The SOI substrate is obtained by forming an SOI layer on a backing insulating layer on a base substrate. When a semiconductor integrated circuit device is formed using an SOI substrate, the SOI layer is isolated into a plurality of element regions. Various methods of isolation will be shown hereinafter.

As a method of isolating the SOI layer into a plurality of element regions, there is a method of isolating them by air isolation as described in Japanese Patent Provisional Publication No. HEI4-116846. According to one aspect of this method, an isolated semiconductor layer having a square section is formed on an insulator by etching, and impurity ions of the same conduction type as that of the semiconductor layer are implanted into the side wall of the isolated semiconductor layer from an oblique direction thereby to form a high concentration region for channel stop. The side walls of respective isolated semiconductor layers rise sharply almost at a right angle. Further, according to another aspect, isolation is made by etching so that the sectional configuration of the semiconductor layer shows a trapezoid, and impurity ions are implanted into the side wall of the isolated semiconductor layer for channel stop. Further, as a document related to air isolation similarly to the foregoing, there is SOLID STATE TECHNOLOGY, JULY 1991, pp. 47–52 "Lateral Isolation in SOI CMOS Technology".

Furthermore, as another method, there is a method of thermally oxidizing an SOI layer selectively by a local oxidation of silicon method (a LOCOS method) thereby to form an isolating film reaching the backing insulating layer. In this method, an oxidation-preventive mask is formed on the surface of the SOI layer that becomes the element region by photolithography technique after an oxidation-preventive film is formed, and the silicon layer is thermally oxidized selectively with the oxidation-preventive mask thereafter so as to form an isolating film.

There has been proposed an SOI/MOSFET in which a MOSFET is formed in an SOI layer isolated by an isolating film. Since the SOI layer is isolated by the backing insulating layer and the isolating film, a drain capacity in the SOI/MOSFET is reduced as compared with that of a MOSFET formed on bulk, and thereby the SOI/MOSFET is expected as a future device.

A method of manufacturing an SOI/MOSFET according to a conventional example will be described hereinafter with reference to FIG. 1A to FIG. 1F and FIG. 2. FIG. 1D is a sectional view taken along a line I—I in FIG. 2. Besides, the structure thereof is described in detail in the citation "H. FUKUDA, etc. 'High-Performance Buried Gate MOSFETs with RTO-Grown Ultrathin Gate Oxide Films' SSDM, 1993, pp. 17–19".

First, a $SiO_2$ film that becomes a backing insulating layer 2 is formed on a silicon substrate by a SIMOX (Separation by Implanted Oxygen) method so as to form an SOI substrate composed of a base substrate 1, the backing insulating layer 2 and an SOI layer 3 as shown in FIG. 1A. At this time, in order to control generation of a strain to the minimum so as to prevent the short channel effect, the film thickness of the backing insulating layer 2 is made as thin as possible. Then, as shown in FIG. 1B, an oxidation-preventive mask 4 composed of a silicon nitride film is formed on the SOI layer 3.

Next, as shown in FIG. 1C, a local oxide film (an isolating film) 5 is formed in the SOI layer 3 by a LOCOS (Local Oxidation of Silicon) method using the oxidation-preventive mask 4 so as to isolate the SOI layer into element regions, and then doping for forming channels is performed in the element regions thereafter.

Then, a removal of the oxidation-preventive mask 4 is followed by forming a gate insulating film 6 composed of a $SiO_2$ film and gate electrode/interconnection 7 composed of a polysilicon film thereon one after another as shown in FIG. 1D. The gate electrode/interconnection 7 means either a gate electrode or a gate interconnection.

Then, source/drain regions (hereinafter referred to as S/D regions) 3a and 3b are formed by diffusing impurities into the SOI layer 3 with the gate electrode/interconnection 7 as a mask as shown in FIG. 1D. The SOI/MOSFET is completed by way of predetermined steps thereafter.

Besides, in the SOI/MOSFET described above, an $n^+$ polysilicon gate doped with As or P is normally used as the gate electrode/interconnection 7 for an n-channel MOS (NMOS) and a p-channel MOS (PMOS). A $p^+$ polysilicon gate into which boron (B) is introduced is not used so often.

Furthermore, in case of forming a CMOS in SOI layers of the one conduction type using the SOI/MOSFET having a structure described above, either an NMOS or a PMOS is necessarily of an accumulation mode (hereinafter referred to as AM) that the conduction types of the channel region and the S/D regions 3a and 3b are same. For example, the channel region is of an $N^-$ type when the S/D regions 3a and 3b are of an $N^+$ type.

In local oxidation of the SOI layer 3 described above, however, an intrusion of an oxide film called a bird's beak 5a is produced in the surface layer of the SOI layer 3 at a boundary between the local oxide film 5 and the SOI layer 3 as shown in FIG. 1D. The configuration of the bird's beak 5a is the same as the case of a normal bulk substrate, but a long protrusion 3d of a single crystal silicon layer is liable to be produced under the bird's beak 5a in the SOI layer 3 in particular as shown in a copy drawing of a section photograph shown in FIG. 3.

In this region, a strain is liable to be produced by the local oxide film 5 and the backing insulating film 2, thus resulting in that the conduction type of the SOI layer 3 is liable to be inverted. Further, when a MOSFET is formed in the SOI layer 3 as shown in FIGS. 4A and 4B, the impurity concentration in the protrusion 3d of the SOI layer 3 under the bird's beak 5a shows a lower concentration than that of a channel region 3c under the gate electrode 7 due to the fact that impurities are implanted into the channel region 3c after the isolating film 5 is formed in the SOI layer 3. In this case, a threshold value (an absolute value) of the channel of a parasitic FET becomes lower than the threshold value (the absolute value) of a normal FET. Further, since the protrusion 3d is fairly apart through the local oxide film 5 from the gate electrode/interconnection 7 that passes over the local oxide film 5, the protrusion 3d becomes a region where it is difficult to be controlled by the gate voltage applied to the gate electrode/interconnection 7. Thus, when the protrusion 3d exists between the S/D regions 3a and 3b, a parasitic FET, which comprises the S/D region 3a, the protrusion 3d as channel region and the S/D region 3b, is operated, thus resulting in increase of a leakage current as shown in FIG. 12B. As a result, OFF characteristics of the normal FET are deteriorated, thus causing malfunctioning. Besides, FIG. 4A, in which a normal FET is shown, is a sectional view taken along a line II—II in FIG. 2. FIG. 4B, in which parasitic FET is shown, is a sectional view taken along a line III—III in FIG. 2.

In order to check the foregoing, the SOI layer 3 on the backing insulating layer 2 is now formed into a mesa shape as shown in FIGS. 5A and 5B, and impurity ions are implanted into a region for forming an isolating film in a perpendicular direction to the substrate surface in advance before forming the isolating film similarly to the case of the bulk substrate as shown in FIG. 12A.

When the SOI layer 3 is formed in a mesa shape, however, stress is concentrated at a corner portion 6a of the SOI layer 3 shown in FIG. 5A, and withstand voltage of a gate oxide film 6 is lowered.

Further, when impurity ions are implanted into the region for forming the isolating film in a perpendicular direction to the region, the parasitic FET may be operated sometimes depending on manufacturing conditions. This is originated in that the quantity of impurities that move to the protrusion 3d of the single crystal silicon layer under the bird's beak 5a is small due to the facts that:

① impurities implanted into the region for forming the isolating film 5 are easily taken into the local oxide film 5 at time of local oxidation, and ② heat treatment for diffusing impurities is not performed since no well is formed in the case of the SOI substrate, being different from the case of the bulk substrate, whereby the implanted impurity ions for forming a channel stop are not diffused after the isolating film 5 is formed.

Further, when the temperature and the period of time for heat treatment of local oxidation are increased for moving the impurities sufficiently into the protrusion 3d of the SOI layer 3, the bird's beak is grown further to the inside of the element region or the impurity region is extended to the element region out of the region under the bird's beak, so that the element region becomes narrower. As a result, it is required to have the element region made larger in advance in anticipation of that extension, which prevents achievement of higher integration level.

Further, since the local oxide film 5 having a film thickness almost double of or more than the thickness of the SOI layer 3 is formed by local oxidation as shown in FIG. 4A, unevenness is produced on the surface of the SOI substrate. Planarization of the SOI substrate surface is desired for achieving higher integration level by forming multilayers and so on.

SUMMARY OF THE INVENTION

It is an object of the present invention to introduce impurities of high concentration sufficiently into an SOI layer adjacent to a backing insulating layer and an isolating film filled up between element regions of the SOI layer so as to surely prevent depletion and inversion, and also to aim at planarization of the surface of the SOI substrate.

Further, it is another object of the present invention to reduce a leakage current and to prevent malfunction in an SOI/MOSFET.

A semiconductor device of the present invention has an isolating film that is adjacent to a semiconductor layer and reaches a backing insulating layer, and the film thickness of the isolating film is getting thicker as approaching to the backing insulating layer from the surface of the semiconductor layer. Also it has an impurity region having a peak of impurity concentration in a semiconductor layer under an isolating layer within a range of 20 nm or more from a contact point between the insulating layer and the isolating film.

Thus, since impurities of high concentration exists in a sufficiently deeper inside of the semiconductor layer under the isolating film, it is possible to surely prevent depletion or inversion of the semiconductor layer originated in a strain caused by the isolating film and the backing insulating layer. For example, when source/drain regions of opposite conduction type are formed in the semiconductor layer, and a high concentration region of a conduction type same as or opposite to that of the semiconductor layer exists therebetween, it is possible to eliminate the influence by a parasitic FET through increasing the threshold value thereof.

In a method of manufacturing a semiconductor device of the present invention, impurity ions are implanted from an oblique direction using an oxidation-preventive mask as a mask for ion implantation so as to reach the semiconductor layer in a sufficiently deeper region inside the edge of the oxidation-preventive mask.

Accordingly, implanted impurities have a concentration peak in the semiconductor layer under the oxidation-preventive mask. In this case, it is desirable that the angle in an oblique direction is set within a range of 30° or less with respect to the perpendicular direction to the surface of the semiconductor layer, and the impurity region has a peak of impurity concentration in the semiconductor layer within a range of 20 nm or more and 50 nm or less from the contact point between the backing insulating layer and the local oxide film when the local oxide film is formed.

With this, even if a bird's beak is produced in the semiconductor layer at the boundary of the element region at time of forming the local oxide film in the semiconductor layer with the oxidation-preventive mask, a concentration peak of impurities is to exist in a semiconductor layer under the bird's beak, which is sufficiently deep from the contact point.

Further, since impurities of high concentration exists in a sufficiently deep region under the bird's beak, it is not required to increase the temperature and the period of time in heat treatment for local oxidation.

With this, it is possible to prevent the impurity region from spreading into the element region out of the region under the bird's beak. Accordingly, since it is unnecessary to leave a margin for the extension of the impurity region, it is possible to make the element region as fine as possible and to achieve higher integration level of the semiconductor device.

Further, in another method of manufacturing a semiconductor device according to the present invention, ion implantation into a semiconductor layer is made from an oblique direction, a local oxide film is formed on the semiconductor layer, an insulating film that becomes a backing insulating layer is formed on the surface thereof, and the semiconductor layer is polished from the back so as to expose the local oxide film, whereby element regions composed of mutually isolated semiconductor layers are formed on the polished side.

Therefore, no difference in level exists at the boundary between the local oxide film surface and the semiconductor layer surface on the side where the element regions are formed. Further, impurities of sufficiently high concentration exist in the semiconductor layer adjacent to the local oxide film. With this, it is possible to improve a planarization of the SOI substrate surface and also to surely prevent depletion, inversion or the like of the SOI layer.

Furthermore, in still another method of manufacturing a semiconductor device according to the present invention, after impurity ions are implanted into the semiconductor layer from an oblique direction so as to reach the semiconductor layer inside the edge of the etching-proof mask, the semiconductor layer is etched with the etching-proof mask, the semiconductor layer on the etched side is covered so as to form an insulating film, and then the semiconductor layer on the opposite side of the side on which the insulating film is formed is polished so as to expose the insulating film, thereby to form element regions composed of mutually isolated semiconductor layers on the polished side.

Therefore, no difference in level exists at the boundary between the insulating film surface and the semiconductor layer surface on the substrate on the side of forming the element regions. Further, impurities of sufficiently high concentration are in existence in the semiconductor layer adjacent to the isolating film. With this, it is possible to improve a planarization of the SOI substrate surface and also to surely prevent depletion, inversion or the like of the SOI layer.

According to another semiconductor device of the present invention, there are provided, through a gate insulating film on a second semiconductor layer such as a silicon layer, gate electrode/interconnection that are formed extending from at least the central portion of the second semiconductor layer across the point of the protrusion.

As a result, the gate electrode/interconnection is formed on the protrusion at the side end of the second semiconductor layer through the gate insulating film, and is sufficiently close to the protrusion unlikely a conventional case. Hence, a sufficiently large electric field by the gate voltage attains to the side end.

According to another method of manufacturing a semiconductor device according to the present invention, after a local oxide film reaching an insulating layer is formed in a second semiconductor layer with an oxidation-preventive mask as a mask, the local oxide film on the protrusion is removed, and then a formation of a gate insulating film is followed by forming a gate electrode extending from the central portion of the second semiconductor layer across the point of the protrusion.

Since only the gate insulating film lies between the protrusion and the gate electrode/interconnection, the vicinity of the point of the protrusion and the gate electrode/interconnection are not apart from each other unlikely a conventional case. As a result, it is possible to apply a sufficiently large electric field by the gate voltage to the vicinity of the point of the protrusion.

With this, a leakage current is prevented from passing between S/D regions of a MOSFET through the protrusion as heretofore experienced, thus preventing malfunction.

Further, by removing the local oxide film at the side end of the second semiconductor layer where stress is liable to be concentrated, the stress at that portion is relieved.

Furthermore, it is desirable to make the film thickness of the insulating layer as thin as possible for checking the short channel effect, and to make the film thickness of the insulating film in an isolating region thicker for reducing the capacity between the base substrate and interconnections. According to setting conditions such that the semiconductor layer under the insulating layer is also oxidized at the time of forming a local oxide film, the film thickness of the insulating film in the isolating region is made thicker, and the capacity between the semiconductor layer and interconnections is decreased.

DESCRIPTION OF THE PREFERRED EMBODIMENTS (1) The first embodiment

A method of manufacturing a MOS transistor according to a first embodiment of the present invention will be described hereinafter with reference to FIG. 6A through FIG. 6G and FIG. 7. FIG. 6A through FIG. 6G are sectional views, and FIG. 7 is a plan view. FIG. 6G shows a section taken along a line V—V in FIG. 7.

A semiconductor device according to the present embodiment is a p-channel SOI/MOSFET of an AM type.

Figure 1A:
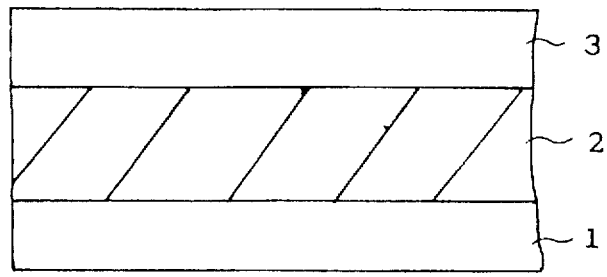
FIG. 1A through FIG. 1D are sectional views showing a method of manufacturing a MOS transistor in an SOI layer isolated by a local oxide film according to a prior art.
Figure 1B:
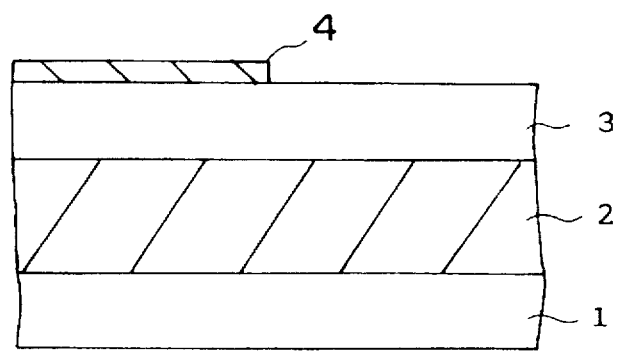
Figure 1C:
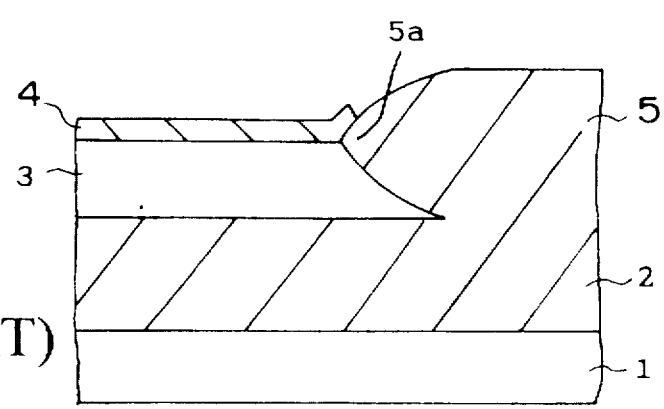
Figure 1D:
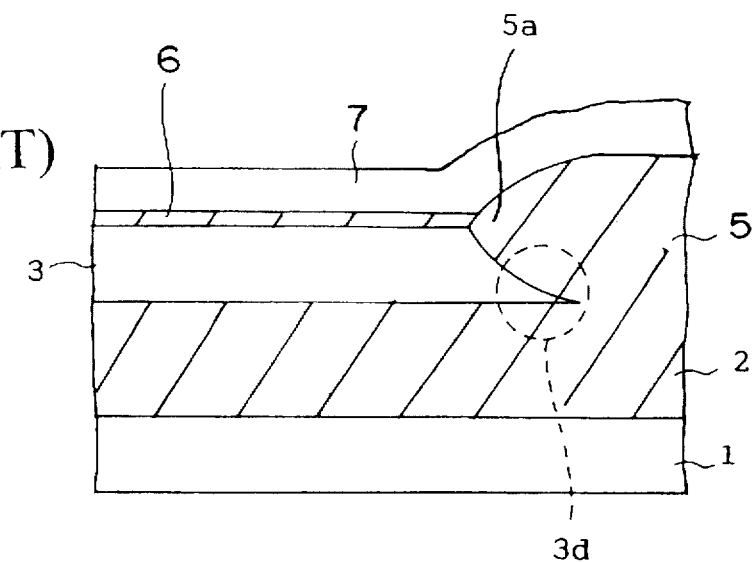
Figure 2:
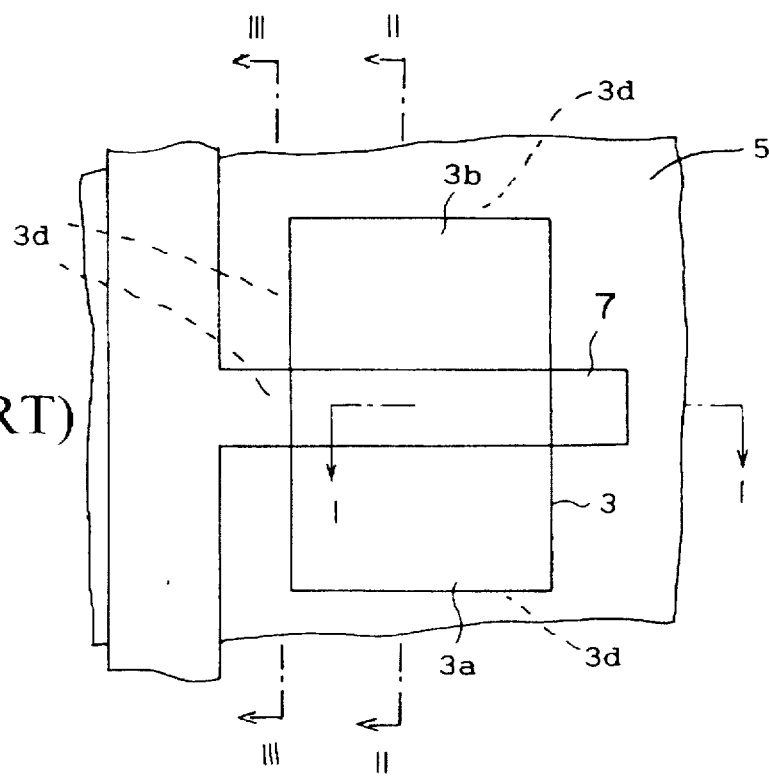
FIG. 2 is a plan view showing a MOS transistor formed in an SOI layer isolated by a local oxide film according to a prior art.
Figure 3:
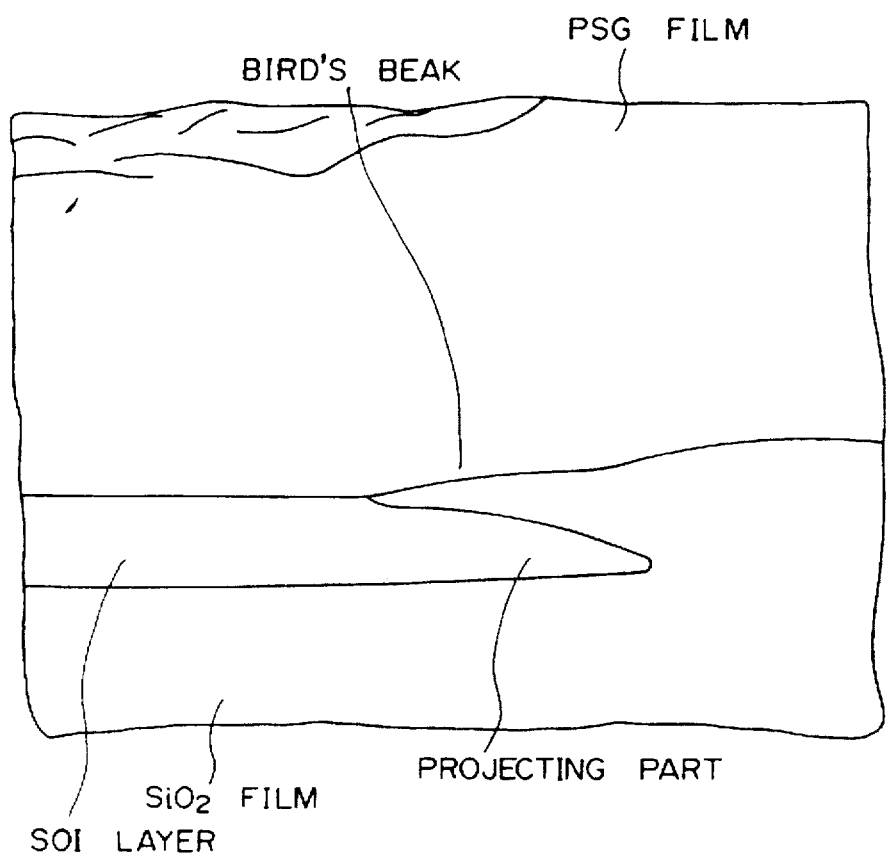
FIG. 3 is a sectional view obtained by copying a photograph showing a sectional structure of an SOI layer isolated by a local oxide film according to a prior art.
Figure 4A:
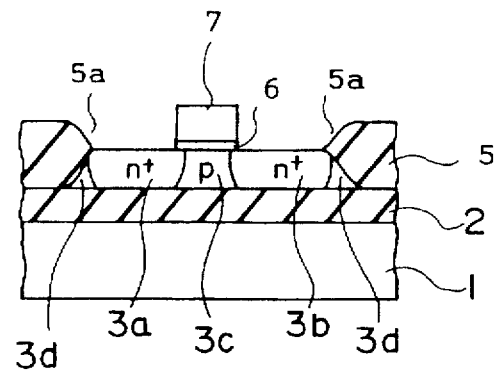
FIG. 4A and FIG. 4B are sectional views showing a MOS transistor formed in an SOI layer isolated by a local oxide film according to a prior art.
Figure 4B:
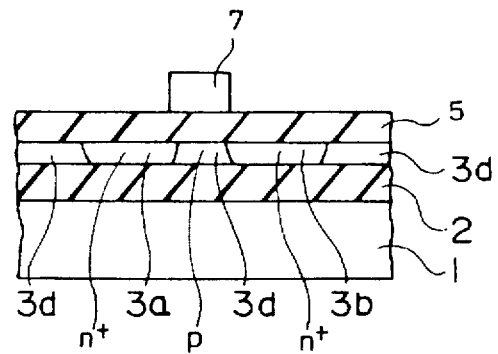
Figure 5A:
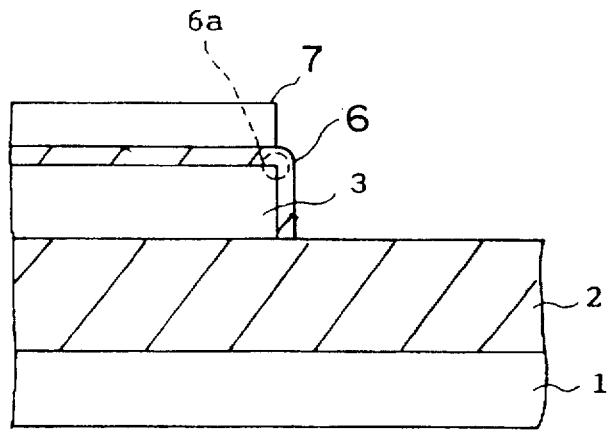
FIG. 5A and FIG. 5B are a sectional view and a plan view showing a MOS transistor formed in an SOI layer isolated by air isolation according to a prior art.
Figure 5B:
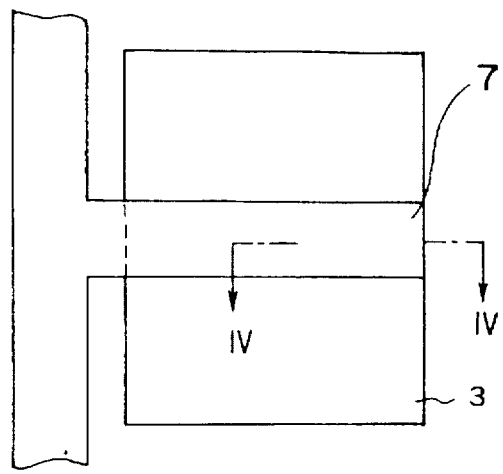
Figure 6A:
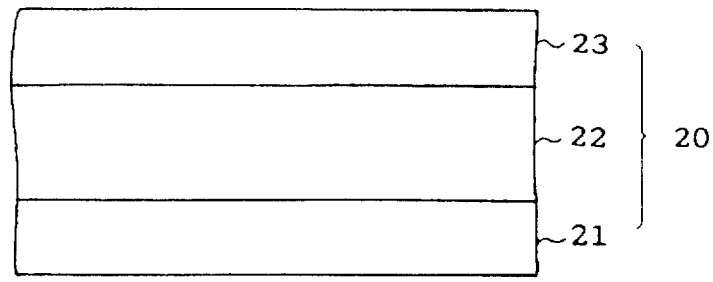
FIG. 6A through FIG. 6G are sectional views showing a manufacturing method of forming a MOS transistor in an SOI layer isolated by a local oxide film according to a first embodiment of the present invention.
Figure 7:
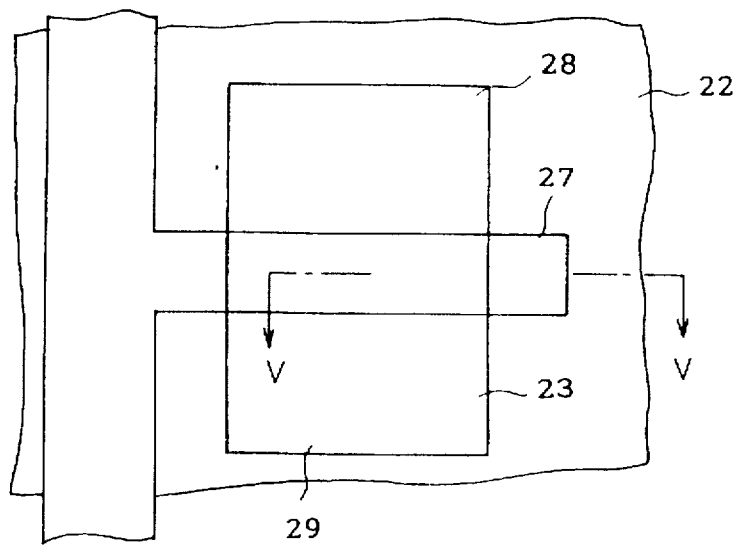
FIG. 7 is a plan view showing a MOS transistor formed in an SOI layer isolated by a local oxide film according to the first embodiment of the present invention.

FIG. 6A shows an SOI substrate 20 formed by a SIMOX method that performs oxygen ion implantation at a predetermined depth of a silicon substrate, and the SOI substrate 20 is composed of a base substrate (a first semiconductor layer) 21 of silicon, a backing insulating layer 22 of a silicon oxide film and an SOI layer (a second semiconductor layer) 23 of silicon. The film thickness of the SOI layer 23 is adjusted at approximately 150 nm through removing the oxide film after the surface of the SOI layer 23 is oxidized.

Figure 6B:
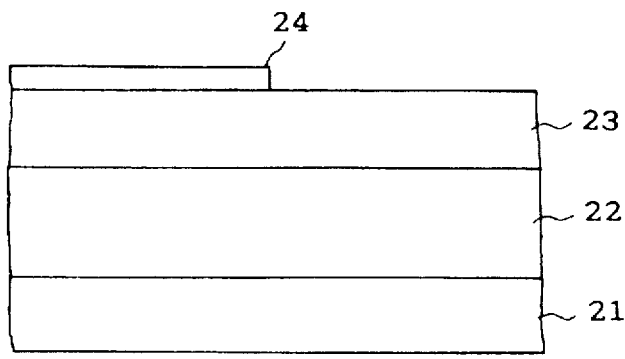
Figure 6C:
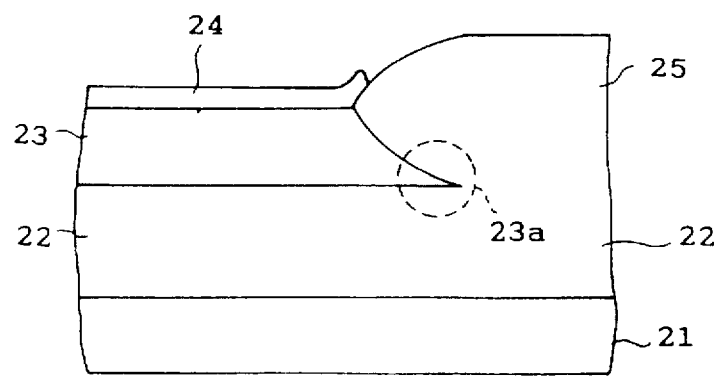

Next, as shown in FIG. 6B, after a silicon nitride film of 150 nm in thickness is formed on the surface of the SOI layer 23, an oxidation-preventive mask 24 is formed in an element region patterning it. Then, as shown in FIG. 6C, the surface of the SOI layer 23 is oxidized in a wet atmosphere at 900° C. with the oxidation-preventive mask 24 as a mask, thereby to form a local oxide film (an isolating film) 25. Since the local oxide film 25 eats into the SOI layer 23 along the boundary between the oxidation-preventive mask 24 and the SOI layer 23 in this step, a protrusion 23a of the SOI layer 23 is formed under the local oxide film 25.

Figure 6D:
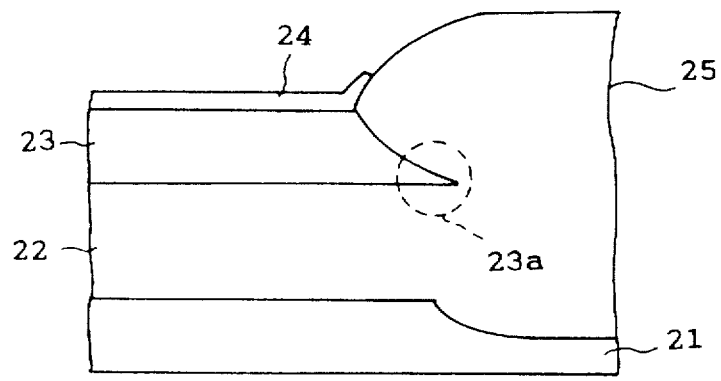

Then, as shown in FIG. 6D, even after the local oxide film 25 reaches the backing insulating layer 22, oxidation is continued until the base substrate 21 under the backing insulating layer 22 is oxidized in the depth of approximately 100 nm.

Figure 6E:
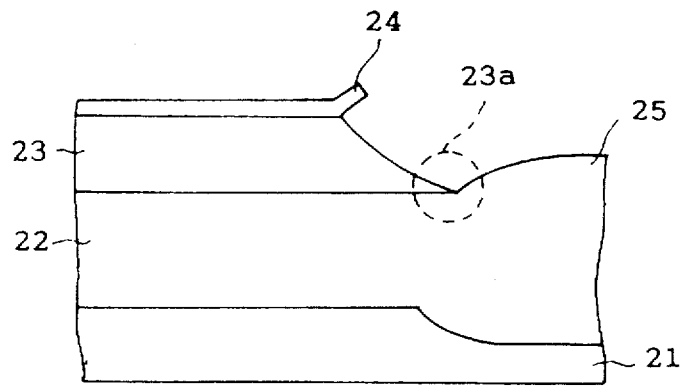

Next, as shown in FIG. 6E, the local oxide film 25 is removed through etching with a hydrofluoric acid etchant by a thickness of approximately 150 nm so as to remove the local oxide film 25 above the protrusion 23a of the SOI layer 23.

Figure 6F:
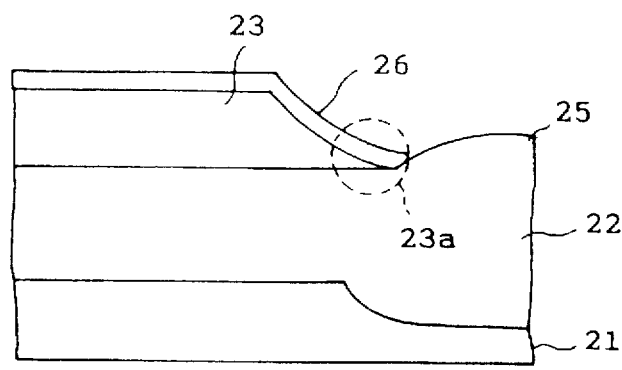
Figure 6G:
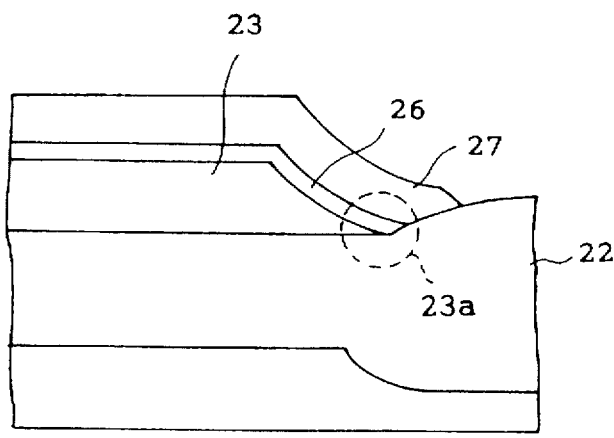

Then, after the oxidation-preventive mask 24 is etched and removed, B$^+$ ions are implanted into the SOI layer 23 with the local oxide film 25 as a mask under the conditions of 15 KeV and 5×10$^{11}$/cm$^2$ for forming a p$^-$ type channel. Then, as shown in FIG. 6F, a gate insulating film 26 having a film thickness of 10 nm is formed by a thermal oxidation method.

Besides, since the SOI layer 23 that becomes an element region bends sharply at the corner thereof, the gate insulating film 26 becomes thinner than a predetermined film thickness at that corner, and the withstand voltage of the gate insulating film 26 is decreased. In order to avoid the above, the step of forming the gate insulating film 26 is performed using rapid thermal oxidation (RTO) at the temperature of 1,100° C. in a dry oxygen atmosphere including Ar of partial pressure of 90%.

Next, after a polysilicon film having a film thickness of 100 nm is deposited by a CVD method, phosphorus (P) ions are implanted into it under the conditions of 40 KeV and 4×10$^{15}$/cm$^2$. Then, a gate electrode/interconnection 27 composed of an n-type polysilicon film that covers the protrusion 23a at the side end of the SOI layer 23 is formed patterning the polysilicon film as shown in FIG. 6G.

Then, B$^+$ ions are ion-implanted with the gate electrode/interconnection 27 as a mask under the conditions of 15 KeV and 4×10$^{14}$/cm$^2$, thereby to form p$^+$ type S/D regions 28 and 29 as shown in FIG. 7. With this, an SOI/MOSFET according to the present embodiment is completed.

Thereafter, rapid thermal anneal (RTA) is performed for 30 seconds at a temperature of 900° C. so as to activate implanted impurities, a PSG film having a film thickness of 300 nm is formed thereon for the purpose of flattening, and then, an interconnection layer composed of aluminum or the like is formed thereon.

As described above, according to the first embodiment of the present invention, after the local oxide film 25 on the protrusion 23a of the SOI layer 23 is removed as shown in FIG. 6E, the gate electrode/interconnection 27 is formed so as to cover the protrusion 23a at the side end of the SOI layer 23 as shown in FIG. 6G. Thus, the protrusion 23a at the side end is formed close to the gate electrode/interconnection 27 unlikely a conventional case, whereby control by the gate voltage comes to reach the protrusion 23a. As a result, it is possible to prevent malfunction such that a leakage current passes between the S/D regions 28 and 29 through the protrusion 23a.

Further, although stress caused by the formation of the local oxide film 25 is liable to be concentrated to the protrusion 23a at the side end of the SOI layer 23, it is possible, by removing the local oxide film 25 on the protrusion 23a, to relieve the stress at that portion.

Furthermore, it is desired that the film thickness of the backing insulating layer 22 is made as thin as possible for checking the short channel effect and the local oxide film 25 in the isolating region is made thicker in order to reduce the capacity between the base substrate 21 and the interconnection. In the present embodiment, however, the base substrate 21 under the backing insulating layer 22 in the isolating region is also oxidized by approximately 100 nm when the local oxide film 25 is formed. Thus, the film thickness of the oxide film in the isolating region is increased, and the capacity between the base substrate/interconnections is reduced.

Besides, a p-channel SOI/MOSFET has been taken for explanation in the present embodiment, but similar effects are also produced with an n-channel. Also, explanation has been made with a single drain structure, but similar effects are also produced with an SOI/MOSFET having a lightly doped drain (LDD) structure.

Further, an SOI substrate formed by a SIMOX method has been described in the present embodiment, but similar effects are also produced with an SOI substrate formed by a laminating method or an epitaxial lateral overgrowth method. The laminating method will be described in a second embodiment described in the next place. Further, in the epitaxial lateral overgrowth method, an insulating film is formed on the single crystal layer, an opening is formed in the insulating layer so as to expose a single crystal substrate, a single crystal layer is grown with the exposed single crystal substrate as a seed, and then, an SOI layer is epitaxially grown on the insulating layer.

Furthermore, oxidation is performed until the base substrate 21 is oxidized by the depth of 100 nm at the time of forming the local oxide film 25 shown in FIG. 6C in the present embodiment. However, the present invention is not limited thereto, but the oxidation may be discontinued at point of time when the SOI layer is oxidized completely.

Besides, the thermal oxidation for forming the gate insulating film 26 is performed under the conditions of RTO in a dry oxygen atmosphere at the temperature of 1,100° C. in the present embodiment. However, the present invention is not limited thereto, but almost similar effects to those of the present embodiment are achievable when the temperature is 1,050° C. or higher.

(2) The second and the third embodiments

Figure 8A:
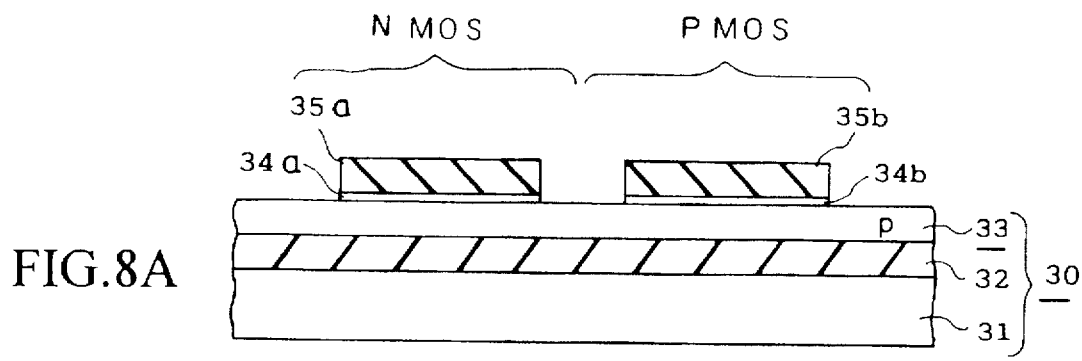
FIG. 8A through FIG. 8F are sectional views showing a manufacturing method of forming a CMOS transistor in an SOI layer isolated by a local oxide film according to a second embodiment of the present invention.
Figure 8B:
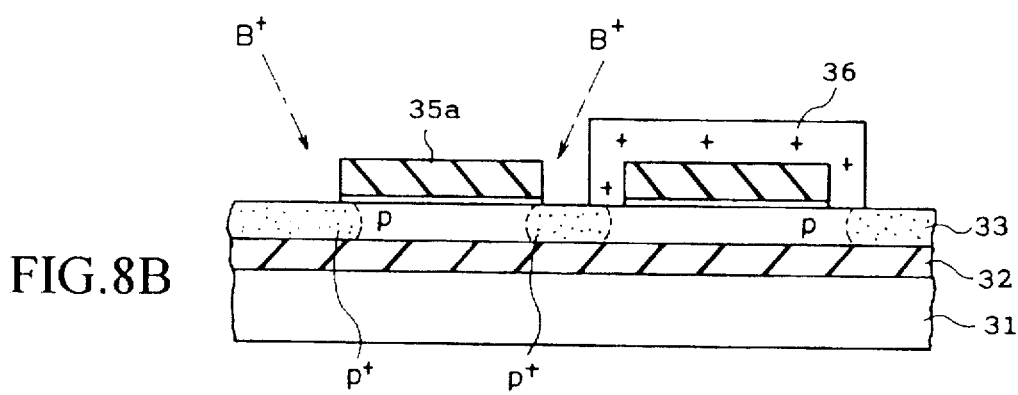
Figure 8C:
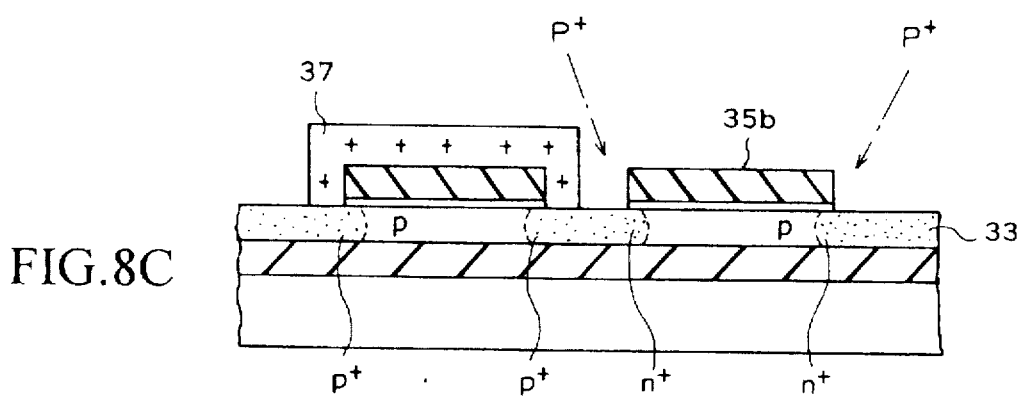
Figure 8D:
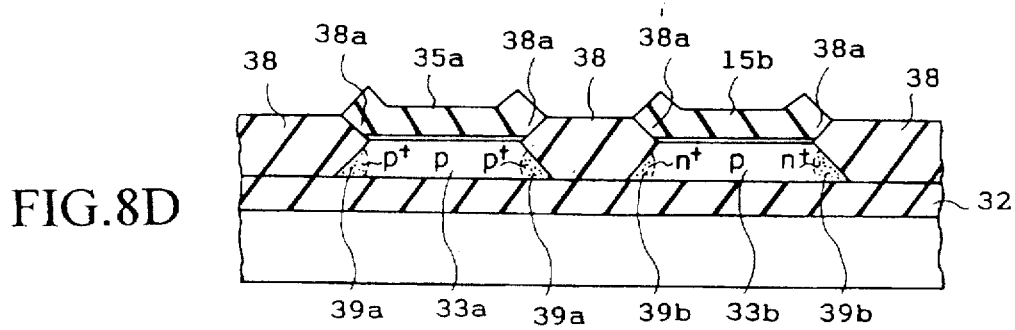
Figure 8E:
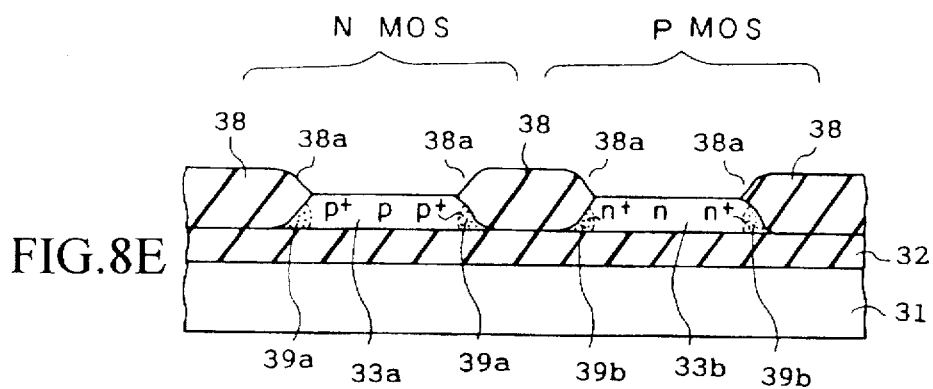
Figure 8F:
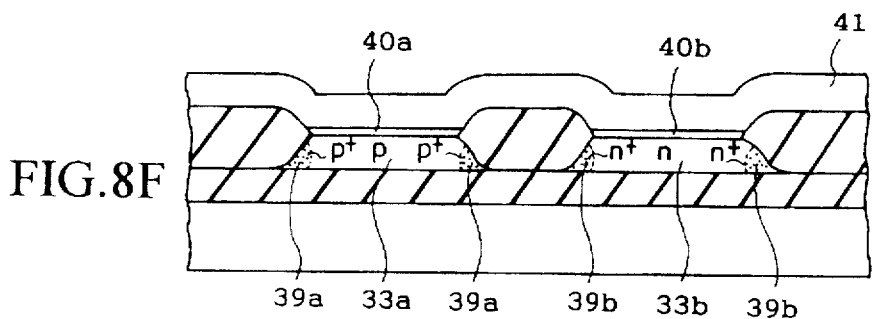
Figure 9:
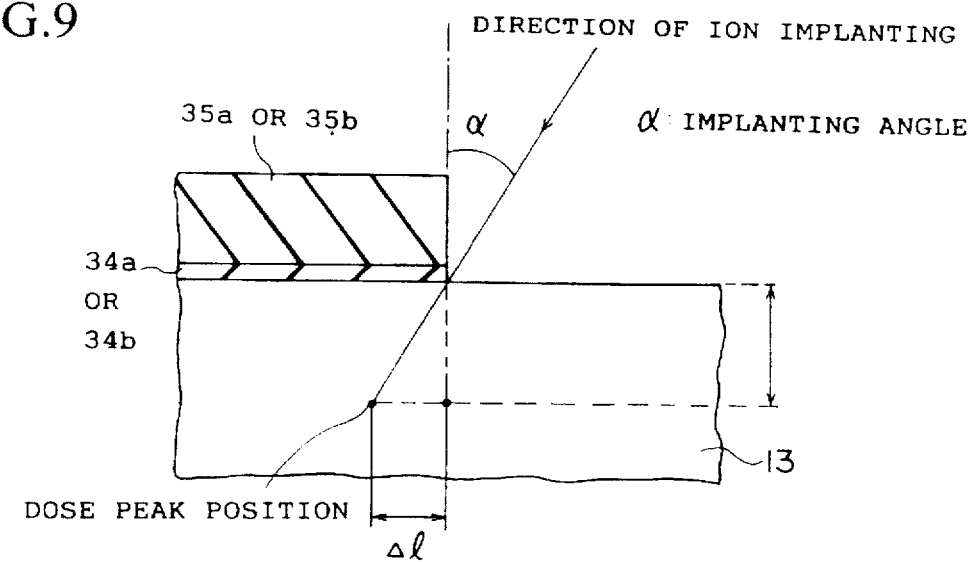
FIG. 9 is a sectional view showing a method of ion implantation into an SOI layer from an oblique direction by means of an oxidation-preventive mask according to the second embodiment of the present invention.
Figure 10A:
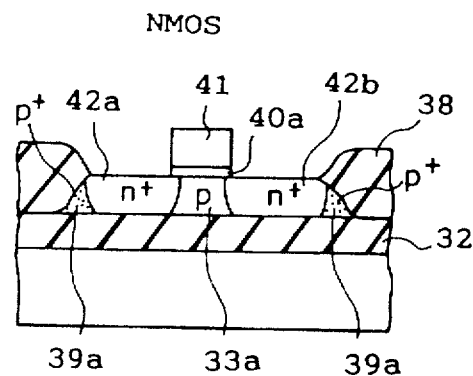
FIG. 10A through FIG. 10C are sectional views showing a CMOS transistor formed in an SOI layer isolated by a local oxide film according to the second embodiment of the present invention.
Figure 10B:
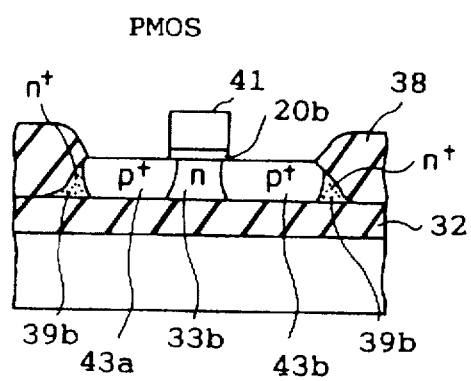
Figure 10C:
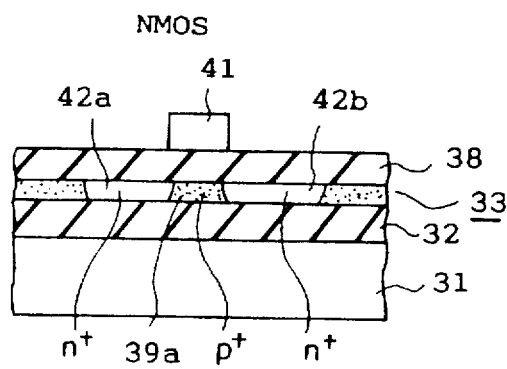
Figure 11A:
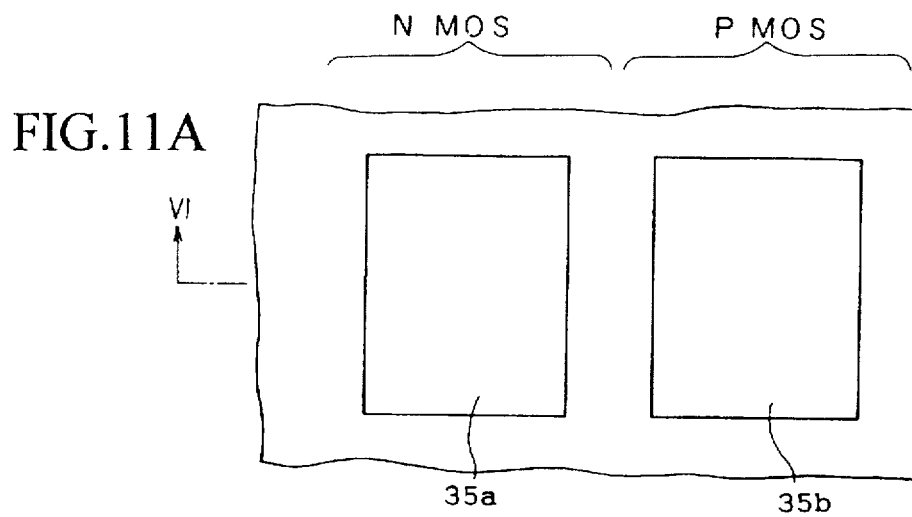
FIG. 11A through FIG. 11C are plan views showing a manufacturing method of forming a CMOS transistor in an SOI layer isolated by a local oxide film according to the second embodiment of the present invention.
Figure 11B:
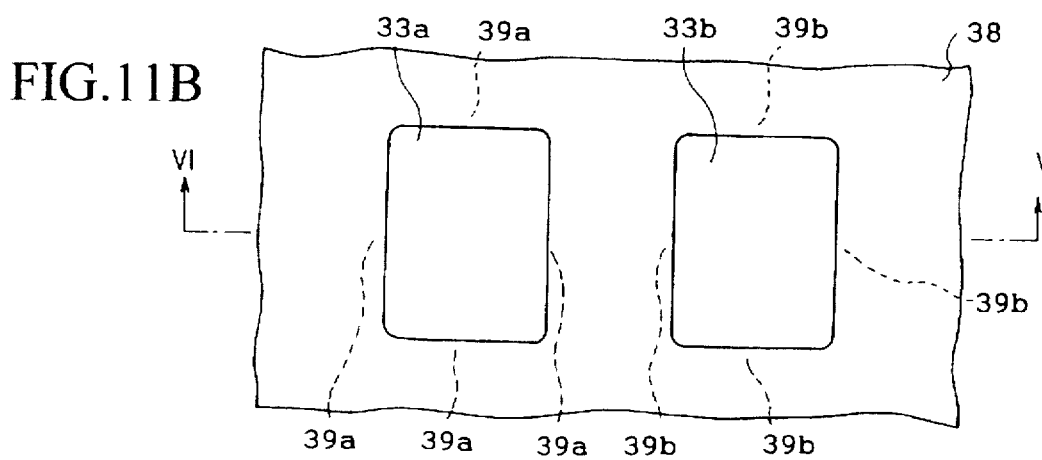
Figure 11C:
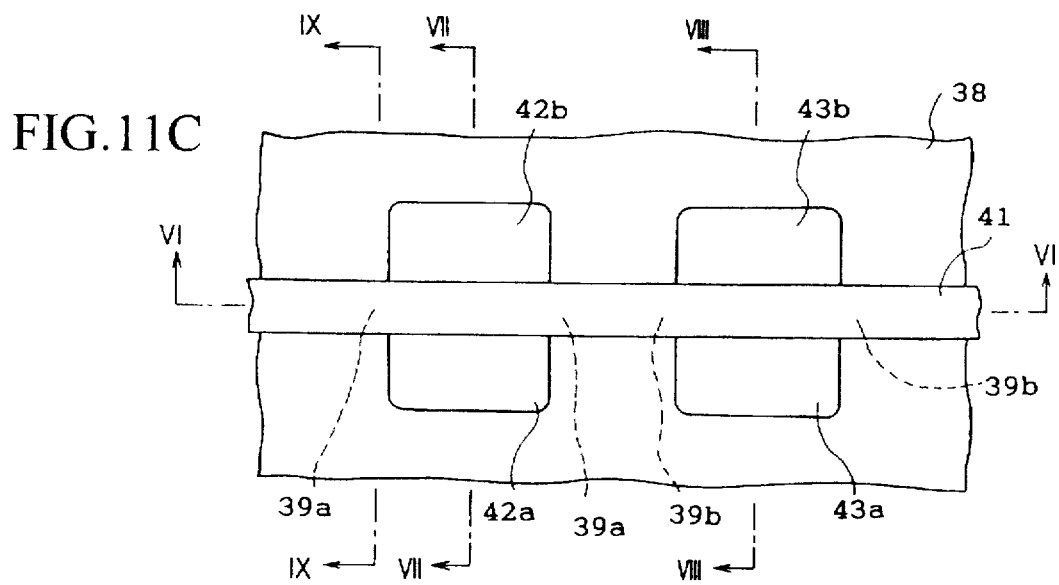

FIG. 8A through FIG. 8F and FIG. 10A through FIG. 10C are sectional views showing a method of isolating an SOI layer with a local oxide film and forming a CMOS transistor in the SOI layer according to a second embodiment of the present invention. Further, FIG. 11A through FIG. 11C are plan views showing the method. FIG. 9 is a sectional view showing a method of ion implantation from an oblique direction into the SOI layer with an oxidation-preventive mask according to the second embodiment of the present invention. FIG. 8A, FIG. 8E and FIG. 8F are sectional views taken along lines VI—VI in FIG. 11A through FIG. 11C, respectively. FIG. 10A is a sectional view taken along a line VII—VII in FIG. 11C. FIG. 10B is a sectional view taken along a line VIII—VIII in FIG. 11C, and FIG. 10C is a sectional view taken along a line IX—IX in FIG. 11C.

First, an SOI substrate is formed by a separation by implanted oxygen (SIMOX) method, a laminating method or the like. In the case of the laminating method, the SOI substrate is formed by laminating silicon substrate placed one upon another through an insulating film by applying voltage while heating them, and then by polishing one side of the silicon substrate to a predetermined film thickness. An SOI substrate 30 thus formed has a structure that a single crystal silicon layer (a semiconductor layer; SOI layer) 33 having a thin film thickness is formed on an insulating film (a backing insulating layer) 32 on a silicon substrate 31 as shown in FIG. 8A. Besides, it is assumed that the SOI layer 33 is of a p-type.

Next, in order to adjust the film thickness of the SOI layer 33 to 100 nm for instance, the surface of the SOI layer is thermally oxidized so as to form a silicon oxide film, and then the silicon oxide film is removed by wet etching using a hydrofluoric acid solution.

Then, as shown in FIG. 8A, the surface of the SOI layer 33 is thermally oxidized so as to form silicon oxide films (pad insulating films) 34a and 34b each having a film thickness of approximately several nm to several ten nm (30 nm for instance). Successively, silicon nitride films 35a and 35b that become oxidation-preventive films are formed thereon by a CVD method in the film thickness of approximately several hundred nm (120 nm for instance). Thereafter, resist masks not shown are formed in regions (element regions) for forming a p-channel MOSFET (a PMOS) and an n-channel MOSFET (an NMOS), respectively, and the oxidation-preventive films are etched anisotropically thereafter with resist masks, thereby to form oxidation-preventive masks 35a and 35b. Besides, the pad insulating films 34a and 34b exposed from the oxidation-preventive masks 35a and 35b may be removed thereafter as shown in FIG. 8A or may not be removed.

Next, as shown in FIG. 8B, the region for forming the PMOS is masked with a resist mask 36. Then, boron (B) ions for instance are implanted at the dose of approximately $5 \times 10^{13}$ cm$^{-2}$ and the acceleration voltage of 25 KeV into the region for forming the NMOS as p-type impurities using the oxidation-preventive mask 35a as a mask for ion implantation. At this time, ion implantation is performed from an oblique direction in order to have impurities of high concentration contained up to sufficiently inside of the SOI layer under the bird's beak formed later.

In this case, as shown in FIG. 9, an implantation angle α in an oblique direction is set to approximately 30 degrees from a perpendicular direction to the surface of the SOI layer 33 so that the high concentration region is not overspread unnecessarily. With this, the position of the dose peak is located in an SOI layer 33 inside (ΔL) of the edge portion of an oxidation-preventive mask 35a by 20 nm or more. In the case of the present embodiment, it is assumed that ΔL=50 nm.

Further, ion implantation is performed from a plurality of directions (for example, four directions with rotation by 90 degrees at a time) so that the high concentration region always exists between opposing S/D regions. Besides, the reason why ion implantation is performed from four directions is to correspond to a case that FETs having the opposing regions of the S/D regions facing directions that meet at right angles are formed on the same substrate. Therefore, when FETs having various directions of opposing regions are formed on the same substrate, the directions of ion implantation are also increased corresponding thereto.

Next, as shown in FIG. 8C, after the resist mask 36 which has masked the region for forming the PMOS is removed, the NMOS is masked with another resist mask 37 similarly to the above. Then, phosphorus (P) ions for instance are implanted as n-type impurities into the region for forming the PMOS under the conditions of the dose of approximately $5 \times 10^{13}$ cm$^{-2}$ and the acceleration voltage of 60 KeV using the oxidation-preventive mask 35b as an ion implantation mask. In this case, ion implantation is also performed in a plurality of directions (for instance, 4 directions with rotation by 90 degrees at a time) and from an oblique direction at the implanting angle of approximately 30 degrees from the perpendicular direction to the substrate surface similarly to the above. Besides, since the n-type SOI layer is often accumulated into an n-type in the region for forming the PMOS, implantation of the channel stop is omitted sometimes.

Then, as shown in FIG. 8D and FIG. 8E, the SOI layer 33 is oxidized thermally with the oxidation-preventive masks 35a and 35b, and a local oxide film (an isolating film) 38 is formed in the regions other than the regions for forming the PMOS and the NMOS. In this case, SOI layers 33a, 33b that become element regions are isolated from each other completely due to the fact that the SOI layer 33 in the isolating region is oxidized completely from the surface thereof to the backing insulating layer 32. At this time, bird's beaks 38a that eat into the regions inside from the edge portions of the oxidation-preventive masks 35a, 35b by approximately 100 to 200 nm are formed. At the same time, p-type high concentration regions (one conduction type regions) 39a are formed in the region for forming the NMOS and n-type high concentration regions (one conduction type regions) 39b are formed in the region for forming the PMOS within the SOI layers 33a, 33b adjacent to the local oxide film 38 from the surface of the SOI layer to the backing insulating layer 32. The p-type and n-type high concentration regions 39a and 39b are formed under the bird's beaks 38a, and the concentration peak position is located in a range of 20 nm or more from a contact point (shown in FIG. 12A) between the backing insulating layer 32 and the local oxide film 38.

Next, in order to adjust the threshold value of the PMOS channel, n-type impurities having a concentration a little higher than the concentration of p-type impurities doped in the SOI layer 33b from the initial stage are introduced into the region for forming the PMOS.

Then, as shown in FIG. 8F, after gate insulating films 40a and 40b are formed on the surfaces of the SOI layers 33a and 33b in the element regions, a gate electrode 41 composed of a polysilicon film having a film thickness of approximately 100 nm is formed on the gate insulating films 40a and 40b. Besides, the gate electrode 41 is formed so as to be continuous from the region for forming the PMOS extending over the region for forming the NMOS.

Next, as shown in FIG. 10B, p-type S/D regions 43a and 43b are formed in the SOI layer on both sides of the gate electrode 41 in the region for forming the PMOS by boron ion implantation. Further, as shown in FIG. 10A, n-type S/D regions 42a and 42b are formed in the SOI layer on both sides of the gate electrode 41 in the region for forming the NMOS by phosphorus ion implantation. At this time, arrangement is made so that p-type and n-type high concentration regions 39a and 39b exist in regions among S/D regions 42a/42b and 43a/43b of the PMOS and the NMOS, respectively.

Thereafter, a CMOSFET is completed by way of a well-known manufacturing process.

Figure 12A:
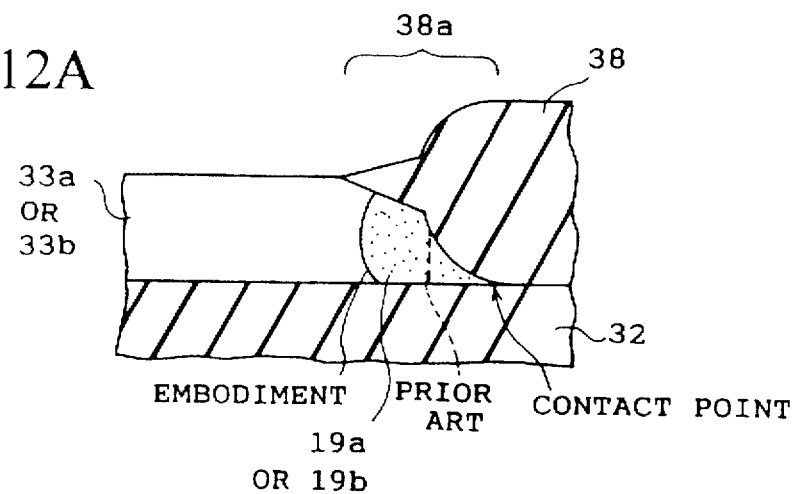
FIG. 12A is a sectional view showing a region for forming a channel stopper under a bird's beak according to the second embodiment of the present invention.
Figure 12B:
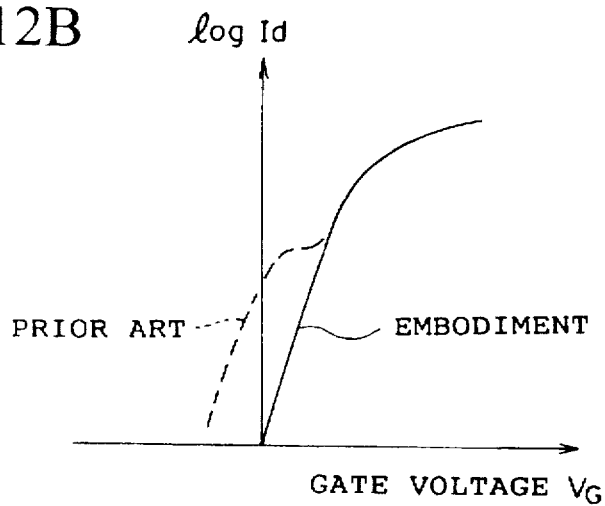
FIG. 12B is a diagram showing a drain current characteristic with respect to gate voltage of a CMOS transistor formed in an SOI layer according to the second embodiment of the present invention.

In the PMOS and the NMOS formed as described above, impurity ions are implanted into the SOI layer 33 from an oblique direction before local oxidation so that the dose peak position falls within the SOI layer 33 under the oxidation-preventive mask 35a or 35b as shown in FIG. 9. Therefore, as shown in FIG. 12A, a p-type or an n-type high concentration region 39a, 39b is formed in the SOI layer 33a, 33b under the bird's beak 38a, which is sufficiently deep from the side end of the SOI layer 33a, 33b. Thus, it is possible to raise a threshold value of a parasitic FET thereby to eliminate the influence thereof by forming a source/drain region in the SOI layer 33a, 33b and arranging so that the p-type or n-type high concentration region 39a or 39b is in existence in the region therebetween. With this, as shown in FIG. 12B, only the MOSFET formed regularly under the gate electrode 41 is operated normally.

On the other hand, when impurity ions are implanted in a perpendicular direction to the substrate surface, n-type and p-type high concentration regions are formed in the SOI layer under the bird's beak and in a region which is shallow from the side end as shown in FIG. 12A. A depth of the region have been approximately 20 nm from the side end according to experiments. Therefore, the threshold value of the parasitic FET cannot be raised sufficiently, but the parasitic FET is operated. As shown in FIG. 12B, the parasitic FET is operated in the range of low gate voltage VG, and the regular MOSFET is not operated until the gate voltage VG is made higher.

Further, since boron or phosphorus of high concentration is in existence in the SOI layer 33a, 33b under the bird's beak 38a and in a region where is sufficiently deep from the side end as described above, it is not required to increase the temperature or the period of time of heat treatment for local oxidation. With this, it is possible to prevent the p-type or n-type high concentration region 39a or 39b from outspreading from the region under the bird's beak 38a toward the inside of the element region. Thus, since it is not required to leave a margin attendant upon the extension of the p-type or n-type high concentration region 39a or 39b, it is possible to make the element region as fine as possible, thus making it possible to achieve higher integration level of the semiconductor device.

Figure 13A:
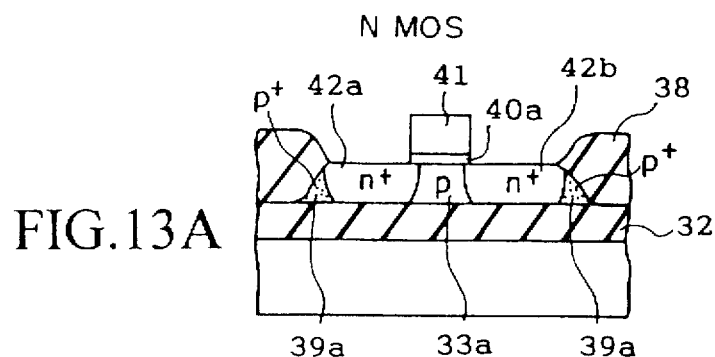
FIG. 13A and FIG. 13B are sectional views showing a CMOS transistor formed in an SOI layer isolated by a local oxide film according to a third embodiment of the present invention.
Figure 13B:
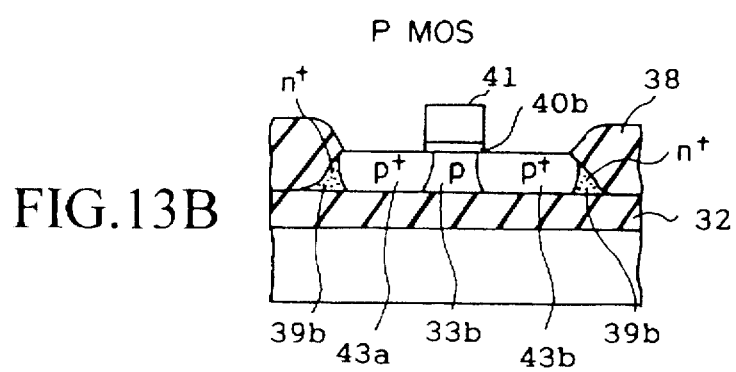

Besides, a PMOS of a depletion mode is used in the CMOS in the second embodiment described above, but that of an accumulation mode (AM) may also be used as shown in FIG. 13A and FIG. 13B of the third embodiment.

In this case, n-type impurities (impurities of opposite conduction type) are also introduced into the p-type SOI layer 33b under the bird's beak of the PMOS by a method similar to the above thereby to form an n-type high concentration region (an opposite conduction type region) as shown in FIG. 13B, and p-type impurities (impurities of one conduction type) are introduced into the p-type SOI layer 33a under the bird's beak of the NMOS by a method similar to the above thereby to form a p-type high concentration region (a one conduction type region) as shown in FIG. 13A. The parasitic FET is always kept in an OFF state by means of an n-type high concentration region (an opposite conduction type region) that becomes the channel stopper of the PMOS.

(3) The fourth embodiment

FIG. 14A through FIG. 14E are sectional views showing a method of forming an SOI substrate according to a fourth embodiment.

What differs from the second embodiment is the fact that a silicon substrate 51 is used, and moreover, ion implantation is made into the silicon substrate 51 from an oblique direction as in the second embodiment, a backing insulating layer 56 is formed on the surface on the side of a local oxide film 55 after the silicon substrate 51 is oxidized locally, the silicon substrate 51 is polished thereafter from the back thereof, and an element region composed of mutually isolated silicon layer (a semiconductor layer) 51a is formed on the polished side. It is intended to eliminate the influence by a parasitic FET and also to achieve flattening of the SOI substrate surface.

Figure 14A:
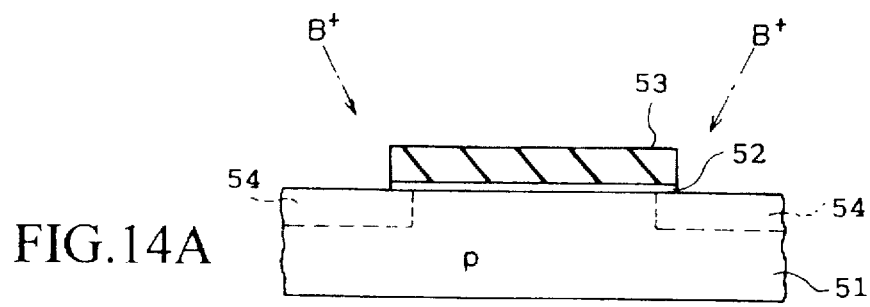
FIG. 14A through FIG. 14E are sectional views showing a method of forming an SOI substrate having an isolated SOI layer according to a fourth embodiment of the present invention.

First, as shown in FIG. 14A, an oxidation-preventive mask 53 composed of a silicon nitride film is formed in the element region on the p-type silicon substrate 51. Besides, a pad insulating film 52 lies between the oxidation-preventive mask 53 and the silicon substrate 51 for preventing a strain.

Then, boron ions are implanted from an oblique direction using the oxidation-preventive mask 53 as a mask for ion implantation. With this, the boron of high concentration reaches the silicon substrate 51 in the region inside the oxidation-preventive mask 53.

Figure 14B:
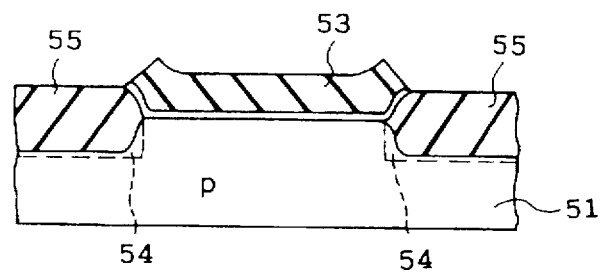

Then, as shown in FIG. 14B, the silicon substrate 51 in the isolating region is thermally oxidized selectively with the oxidation-preventive mask 53, thereby to form a local oxide film 55. At this time, a p-type high concentration region (a regional layer of one conduction type) 54 is formed in the silicon substrate 51 in the region adjacent to the local oxide film 55 by the implanted boron.

Figure 14C:
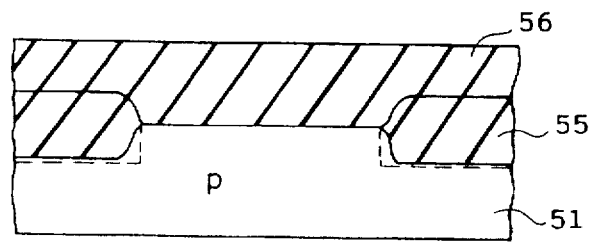

Next, after the oxidation-preventive mask 53 is removed, an insulating film 56 composed of a silicon oxide film having a film thickness of approximately 1 μm is formed on the surface of the silicon substrate 51 on the side of the local oxide film 55 as shown in FIG. 14C. Besides, this insulating film becomes the backing insulating layer of the SOI substrate.

Figure 14D:
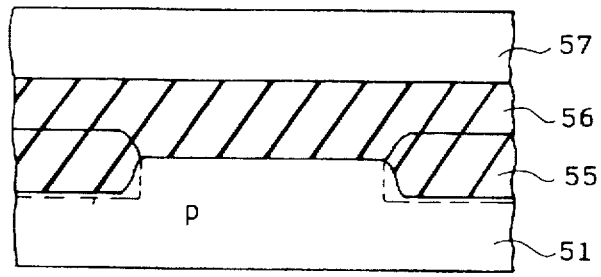

Then, as shown in FIG. 14D, another silicon substrate 57 is adhered onto the insulating film 56 by a well-known laminating method.

Figure 14E:
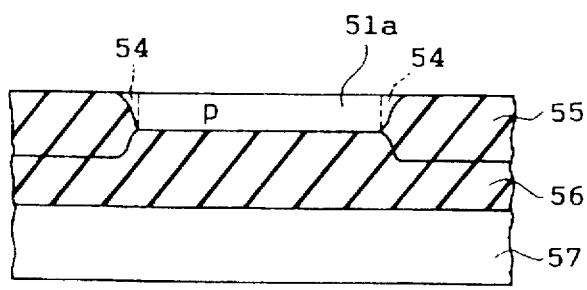

Next, as shown in FIG. 14E, the silicon substrate 51 on which the local oxide film 55 is formed is polished physically and chemically from the back thereof, thereby to expose the local oxide film 55. With this, an element region composed of isolated silicon layer (an SOI layer) 51a is formed on the substrate surface on the polished side. Besides, the silicon layer 51a is isolated by the insulating film 56 at the lower side and by the local oxide film 55 at the side.

Thereafter, an insulated gate field effect transistor is formed in the element region by a well-known method. At this time, the S/D regions are arranged so that a p-type high concentration region exists between these regions. With this, it is possible to eliminate the influence by the parasitic FET.

As described above, in the fourth embodiment, ion implantation is made into the silicon substrate 51, the insulating film 56 that becomes a backing insulating layer is formed on the surface on the side of the local oxide film 55 after the local oxide film 55 is formed on the silicon substrate 51, and the silicon substrate 51 is polished thereafter from the back of the silicon substrate 51 so as to expose the local oxide film 55, thereby to form an element region composed of mutually isolated silicon layer 51a on the substrate surface on the polished side.

Accordingly, no difference in level exists at the boundary between the surface of the local oxide film 55 and the surface of the silicon layer 51a on the surface on the side that the element region is formed. Further, a p-type region 54 of sufficiently high concentration is formed in the SOI layer 51a in the region adjacent to the local oxide film 55. With this, it is possible to aim at flattening of the SOI substrate surface and also to prevent depletion or inversion of the SOI layer 51a surely.

(4) The fifth embodiment

FIG. 15A through FIG. 15E are sectional views showing a method of forming an SOI substrate according to a fifth embodiment. What differs from the fourth embodiment is the fact that a local oxide film by a local oxidation method is not used as the isolating film.

Figure 15A:
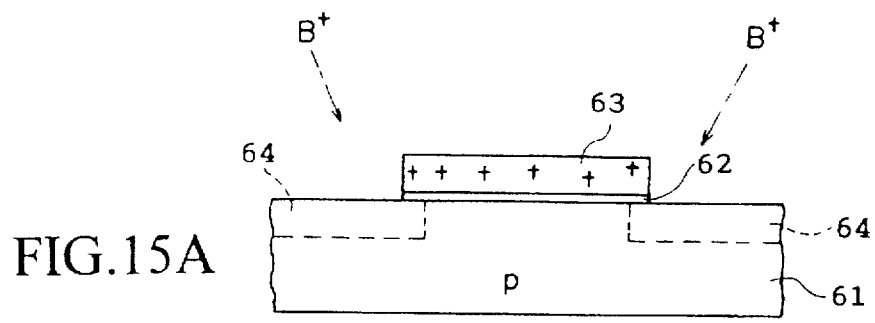
FIG. 15A through FIG. 15E are sectional views showing a method of forming an SOI substrate having an isolated SOI layer according to a fifth embodiment of the present invention.

First, as shown in FIG. 15A, after a p-type silicon substrate 61 is oxidized thermally so as to form a silicon oxide film 62 having a film thickness of approximately 30 nm, a resist film is formed on the silicon oxide film 62 that becomes an element region and applied with patterning, thereby to form a resist mask (an etching resisting mask) 63.

Then, boron ions (impurities of one conduction type) are implanted from an oblique direction, using the resist mask 63 as a mask for ion implantation, so as to reach the silicon substrate 61 in the region inside the edge portion of the resist mask 63.

Figure 15B:
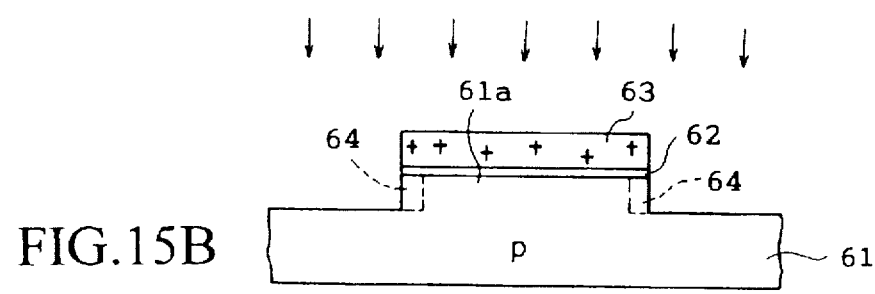

Then, as shown in FIG. 15B, the silicon substrate 61 in the isolating region is etched anisotropically by the film thickness portion of the SOI layer with the resist mask 63, thereby to form a protruded portion 61a in a height corresponding to the film thickness of the SOI layer.

Figure 15C:
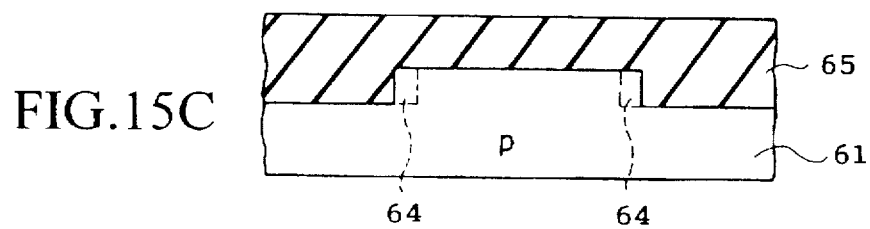

Next, as shown in FIG. 15C, heat treatment is made after the resist mask 63 is removed. With this, a p-type high concentration region (a region of one conduction type) 64 is formed at the side peripheral portion of the protruded portion 61a of the silicon substrate 61.

Figure 15D:
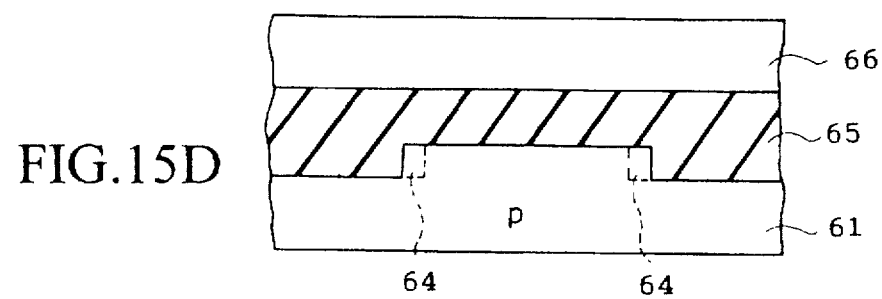

Then, as shown in FIG. 15D, the surface of the silicon substrate 61 on the side where the resist mask 63 is removed is covered, and a silicon oxide film 65 having a film thickness of approximately 1 μm is formed by CVD. The silicon oxide film 65 becomes a backing insulating layer and an isolating film later. Besides, the surface of the silicon oxide film 65 is flattened by polishing or the like when necessary.

Figure 15E:
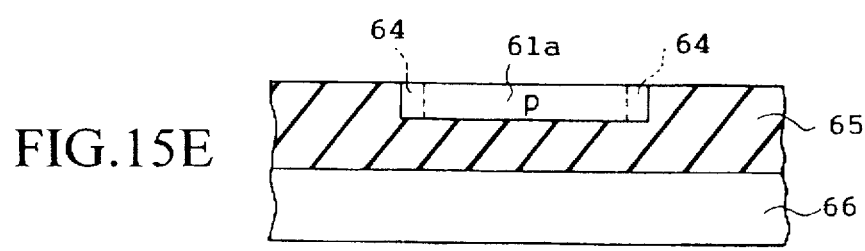

Then, as shown in FIG. 15E, another silicon substrate 66 is adhered onto the silicon oxide film 65, and the silicon substrate 61 on the etched side is polished from the back physically and chemically so as to expose the silicon oxide film 65. With this, an element region composed of a silicon layer (a semiconductor layer; an SOI layer) 61a isolated by the silicon oxide film (an isolating film) 65 is formed on the polished surface. At this time, the p-type high concentration region 64 exists in the silicon layer 61a adjacent to the silicon oxide film 65.

Thereafter, an insulated gate field effect transistor or the like is formed in the silicon layer 61a. At this time, S/D regions are arranged so that a p-type region exists therebetween. With this, it is possible to eliminate the influence by the parasitic FET.

As described above, in the fifth embodiment, the silicon substrate 61 is etched with the resist mask 63 after ion implantation is made from an oblique direction using the resist mask 63 as a mask for ion implantation, and thereafter, the silicon substrate 61 is polished from the back thereof so as to expose the silicon oxide film 65 after the silicon oxide film 65 is formed on the silicon substrate 61 on the etched side, thereby to form an element region composed of mutually isolated silicon layer 61a.

Thus, no difference in level exists at the boundary between the surface of the silicon oxide film 65 and the surface of the silicon layer 61a on the substrate surface on the side that the element region is formed. Further, since ion implantation is made from an oblique direction, it becomes possible to contain impurities of high concentration by the SOI layer 61a at the boundary portion with the isolating film 65 as compared with the ion implantation from a perpendicular direction in the past.

With this, it is possible to aim at flattening of the SOI substrate surface, and to surely, prevent depletion or inversion of the SOI layer 61a.

Besides, in the fifth embodiment described above, ion implantation in an oblique direction is made before etching of the silicon substrate 61 as shown in FIG. 15A, but it may also be performed after etching of the silicon substrate 61.

What is claimed is:

1. A method of manufacturing a semiconductor device comprising the steps of:

forming a first semiconductor layer and a second semiconductor layer putting an insulating layer therebetween;

forming an oxidation-preventive mask on said second semiconductor layer;

oxidizing said second semiconductor layer locally with said oxidation-preventive mask to form a local oxide film that reaches said insulating layer so as to form a protrusion of said second semiconductor layer at the side portion of said second semiconductor layer;

removing said local oxide film on said protrusion; and forming a gate insulating film and gate electrode/interconnection one after another on said second semiconductor layer, in order that said gate electrode/interconnection is extending on the protrusion.

2. The method of manufacturing a semiconductor device according to claim 1, wherein said step of removing said local oxide film on said protrusion results in leaving, in an outer peripheral portion of said protrusion, an insulating film which has a film thickness thicker than that of said insulating layer.

3. The method of manufacturing a semiconductor device according to claim 1, wherein said second semiconductor layer is a silicon layer.

4. The method of manufacturing a semiconductor device according to claim 1, wherein the substrate composed of said first semiconductor layer, said insulating layer and said second semiconductor layer is formed using one selected from the group consisting of a SIMOX method, a laminating method and an epitaxial lateral overgrowth method.

* * * * *